(12) United States Patent
Wann et al.

(10) Patent No.: US 10,535,573 B2
(45) Date of Patent: Jan. 14, 2020

(54) SYSTEM AND METHOD FOR TEST KEY CHARACTERIZING WAFER PROCESSING STATE

(71) Applicant: Taiwan Semiconductor Manufacturing Company, Ltd., Hsinchu (TW)

(72) Inventors: Clement Hsingjen Wann, Carmel, NY (US); Ling-Yen Yeh, Hsinchu (TW); Chi-Yuan Shih, Hsinchu (TW); Wei-Chun Tsai, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/383,416

(22) Filed: Apr. 12, 2019

(65) Prior Publication Data

US 2019/0237370 A1 Aug. 1, 2019

Related U.S. Application Data

(60) Continuation of application No. 15/250,764, filed on Aug. 29, 2016, now Pat. No. 10,269,666, which is a division of application No. 14/030,857, filed on Sep. 18, 2013, now Pat. No. 9,431,288.

(51) Int. Cl.
| | |
|---|---|
| *H01L 21/66* | (2006.01) |
| *H01L 23/544* | (2006.01) |
| *H01L 21/762* | (2006.01) |
| *H01L 27/088* | (2006.01) |
| *H01L 29/06* | (2006.01) |

(52) U.S. Cl.
CPC ........ *H01L 22/32* (2013.01); *H01L 21/76224* (2013.01); *H01L 22/34* (2013.01); *H01L 23/544* (2013.01); *H01L 27/0886* (2013.01); *H01L 29/0649* (2013.01); *H01L 2223/54453* (2013.01)

(58) Field of Classification Search
CPC ........ H01L 22/32; H01L 22/34; H01L 23/544
USPC ........................... 257/48; 438/11, 14, 15, 18
See application file for complete search history.

(56) References Cited

U.S. PATENT DOCUMENTS

| | | | |
|---|---|---|---|
| 2005/0134857 A1 | 6/2005 | Maury et al. | |
| 2008/0142997 A1* | 6/2008 | Kuo .................. | H01L 22/34 257/797 |
| 2008/0159475 A1 | 7/2008 | Mazor et al. | |
| 2009/0121321 A1 | 5/2009 | Miccoli et al. | |
| 2009/0174002 A1 | 7/2009 | Ouyang et al. | |
| 2009/0243044 A1* | 10/2009 | Tanaka ............. | H01L 23/3171 257/618 |

(Continued)

*Primary Examiner* — Didarul A Mazumder
(74) *Attorney, Agent, or Firm* — Slater Matsil, LLP

(57) ABSTRACT

Disclosed herein is a method for forming a test key system for characterizing wafer processing states, the method comprising forming a plurality of shallow trench isolation structures (STIs) on a substrate of a wafer and in a scribe line of the wafer and forming a test key on the substrate of a wafer and in the scribe line of the wafer. Forming the test key comprises forming at least one test key group having a plurality of test key series, each of the plurality of test key series having a plurality of test pads, each one of the plurality of test key series having a first physical characteristic different from the first physical characteristic of other test key series the at least one first test key group.

20 Claims, 13 Drawing Sheets

(56) References Cited

U.S. PATENT DOCUMENTS

| | | | |
|---|---|---|---|
| 2010/0045325 A1* | 2/2010 | Doong | H01L 22/34 |
| | | | 324/756.03 |
| 2010/0123134 A1* | 5/2010 | Nagata | H01L 22/12 |
| | | | 257/48 |
| 2010/0127355 A1* | 5/2010 | Mariani | H01L 21/78 |
| | | | 257/620 |
| 2010/0210043 A1 | 8/2010 | Liu et al. | |
| 2011/0230004 A1 | 9/2011 | Li et al. | |
| 2013/0026464 A1 | 1/2013 | Liao et al. | |
| 2013/0043470 A1* | 2/2013 | Huang | H01L 23/562 |
| | | | 257/48 |
| 2013/0221353 A1* | 8/2013 | Yang | H01L 22/32 |
| | | | 257/48 |
| 2013/0240996 A1 | 9/2013 | Yin et al. | |

* cited by examiner

SYSTEM AND METHOD FOR TEST KEY CHARACTERIZING WAFER PROCESSING STATE

PRIORITY CLAIM

This application claims priority and is a continuation of U.S. patent application Ser. No. 15/250,764, filed on Aug. 29, 2016, and entitled "System and Method for Test Key Characterizing Wafer Processing State," which application is a divisional of U.S. patent application Ser. No. 14/030,857, filed on Sep. 18, 2013, now U.S. Pat. No. 9,431,288 issued on Aug. 30, 2016 and entitled, "System and Method for Test Key Characterizing Wafer Processing State," which applications are incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. As die sizes shrink and component counts increase, the reliability of individual components such as transistors becomes more critical. In some instances, wafers may be blanket tested prior to, and during, formation of layers and structures on the wafer.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to illustrate the relevant aspects of the embodiments and are not necessarily drawn to scale.

DETAILED DESCRIPTION

The making and using of the presented embodiments are discussed in detail below. It should be appreciated, however, that the present disclosure provides many applicable concepts that can be embodied in a wide variety of specific contexts. The specific embodiments discussed are merely illustrative of specific ways to make and use the described wafer level test key system and method, and do not limit the scope of the disclosure.

Embodiments will be described with respect to a specific context, namely making and using test keys useful in, for example, testing and dicing dies or wafers during and after integrated circuit fabrication. Other embodiments may also be applied, however, to substrates, structures or devices or combinations of any type of integrated circuit device or component.

The embodiments of the present disclosure are described with reference to FIGS. 1A through 7, and variations of the embodiments are also discussed. Throughout the various views and illustrative embodiments of the present disclosure, like reference numbers are used to designate like elements. Additionally, the drawings are intended to be illustrative, are not to scale and are not intended to be limiting. Note that, for simplification, not all element numbers are included in each subsequent drawing. Rather, the element numbers most pertinent to the description of each drawing are included in each of the drawings.

Embodiments described herein pertain to forming and testing wafer-level test keys with test pads having physical characteristics related to the physical characteristics of semiconductor devices formed in dies on the wafer. The test pads are, in an embodiment, formed using the same processes used to form the semiconductor devices, permitting testing and verification of the processes without contaminating or interfering with the production devices. The test pads may also be formed in dicing streets of the wafer so that the test pads are removed during dicing, and wafer real estate is conserved. Placing test pads on the production wafer instead of using sacrificial wafers for testing reduces wafer-to-wafer variation that may not be perceived with dedicated test wafers. A test key with one or more test pads may also permit ranges of physical characteristics to be tested, such as strain relaxation, dopant activation and deactivation, or the like.

Figure 1A:
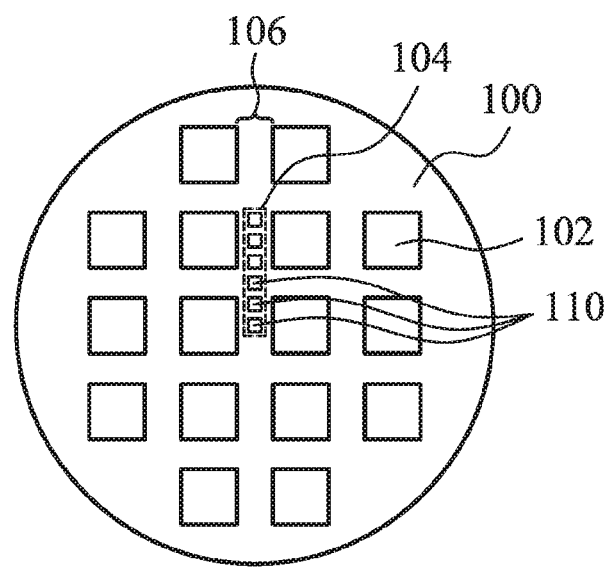
FIGS. 1A through 1C illustrate the arrangement of test pads according to an embodiment.

FIG. 1A is a top view illustrating a wafer 100 having a plurality of dies 102 with test keys 104. A wafer 100 dies 102 disposed thereon, with the dies 102 separated by a scribe line 106 or dicing street. While only a few dies 102 are shown in the figures for clarity, any number of dies 102 may be processed on a wafer or workpiece. The dies 102 are separated by the scribe line 106 on the wafer 100 to provide a space for a saw, laser or other cutting system to singulate or cut the wafer into individual dies 102 without cutting or damaging the dies 102. A test key 104 has one or more test pads 110 and is disposed in a scribe line 106 so that the test key 104 is removed when the wafer 100 is cut. Placing the test key 104 in the scribe line 106 permits the test key 104 to be placed in the wafer 100 without taking up space for dies 102.

Figure 1B:
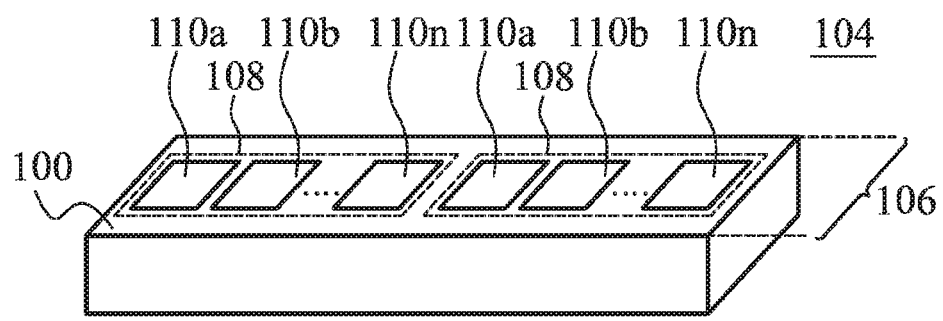

FIG. 1B illustrates a test key 104 according to an embodiment. The test key 104 has one or more test key series 108, with each test key series 108 have a series of test pads 110a . . . 110n, with the test pads 110a . . . 110n sharing at least one trait. For example, a first test key series may have test pads 110a . . . 110n formed using a first epitaxial characteristic and second test key series 108 may have a second epitaxial characteristic. In another example, the test pads 110a . . . 110n of a first test key series 108 may have a similar doping profile, and the test pads 110a . . . 110n of a second test key series 108 may have a second doping profile.

The test pads 110a . . . 110n are formed as part of the substrate of a wafer 100, or are formed within the wafer 100. Additionally, the test pads 110a . . . 110n may be formed as part of the process for fabricating the integrated circuit structures of the die 102. Using the same process for forming the test pads 110a . . . 110n and the structures of the die 102 results in the test pads 110a . . . 110n having a physical characteristics similar or related to the structures of the die 102. Therefore, the test pads 110a . . . 110n can be used to test the characteristics the wafer 100 during processing. For example, test pads 110 may be formed in a silicon substrate with a doping profile the same as a source or drain of a transistor in a die 102. In another example, the test pad 110 has one or more epitaxial regions, fins, strained regions, or the like, that mirror or are related to one or more features or structures in a die 102.

Figure 1C:
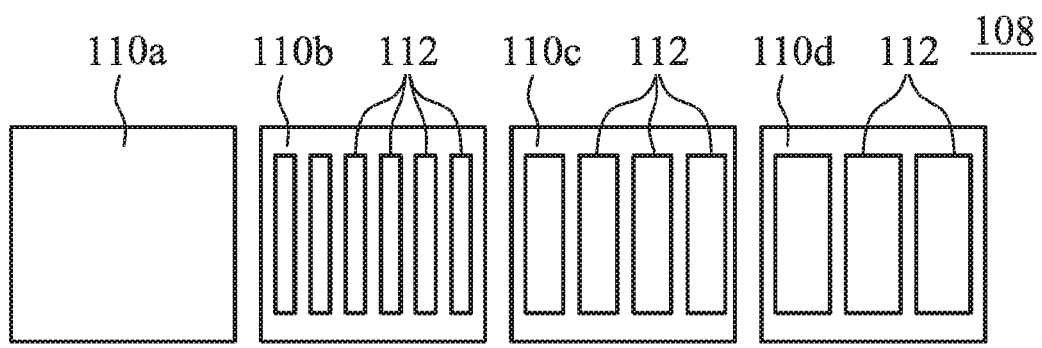

FIG. 1C is a diagram illustrating a test key series 108 according to an embodiment. The test key series 108 has a series of different test pads 110a . . . 110d. In an embodiment, the test pads 110a . . . 110d may be varied with different size fins 112. For example, a first test pad 110a may have all, or substantially all, of a surface formed as a fin or test surface with a predetermined physical characteristic. In such an example, the test surface of the first test pad 110a may be treated as a single large fin. A second test pad 110b may have many relatively narrow fins 112, while a third test pad 110c has fewer, wider fins 112, and a fourth test pad has yet fewer, even wider fins 112. The width and length of the fins 112 may vary from a few nanometers to a few micrometers. In an embodiment, the width and length of the fins 112 is between about 2 nm and about 3 μm, with the length of a fin 112 at least about twice as great as the width of the fin 112. In an embodiment, the fins 112 have physical characteristics related to structures of the dies 102, permitting testing of the processes used to form the die structures without interfering with or contaminating the die structures themselves.

In a single test key series, the fins 112 of the second, third and fourth test pads 110b . . . 110d have one or more physical characteristics similar or identical to the single fin 112 of the first test pad 110a. For example, the test pads 110a . . . 110d may have fins 112 of silicon germanium (SiGe) formed using an epitaxial growth process. Additionally, the test surface or fins 112 may be formed from a material or using a process that imparts a predetermined strain on the material. In such an example, the test surface or fins 112 may be formed from SiGe epitaxially grown over a silicon substrate, creating a strained SiGe region. The fins 112 of the test pads 110a . . . 110n are thus formed from a different semiconductor compound than the substrate, and the test pads 110a . . . 110n may all have a similar physical characteristic. In another example, a gallium arsenide (GaAs) or other semiconductor layer may be epitaxially grown over silicon or other substrate having a lattice mismatch creating strain in the fins 112. The different fin 112 layouts reflect different electron or hole mobility in the fin 112 material due to different strain in the differently sized fins 112.

The test pads 110a . . . 110n are sized to permit testing with a contact-type test such as a 4-point probe (4PP), spreading resistance profiling (SRP), or with a non-contact disruptive or destructive test such as secondary ion mass spectrometry (SIMS). In an embodiment, the test pads 110 may be at least about 50 μm wide and at least about 50 μm long. The test pads 110 also have a depth of less than about 100 nm, and in an embodiment, have a depth between about 10 nm and about 90 nm. The test pads 110 are also limited by the width of the scribe line, with the test pad 110 being narrower in at least one dimension than the scribe line 106 so that the test pads 110 are removed through the die sawing process. Placing test keys 104 in the scribe line 106 permits a contact-type or destructive test to be performed during wafer processing without interfering with the final integrated circuit. For example, a 4PP test may use a metal probe that leaves some metal contamination on the test pad 110, and placing the test key 104 in the scribe line 106 limits any contamination to the scribe line 106 area. Similarly, the use of a SIMS test tends to cause crystalline damage from ablation of the surface when creating samples. Placing the test key 104 in the scribe line 106 prevents the damage created in the test key 104 from impacting final devices in the dies 102.

Figure 2:
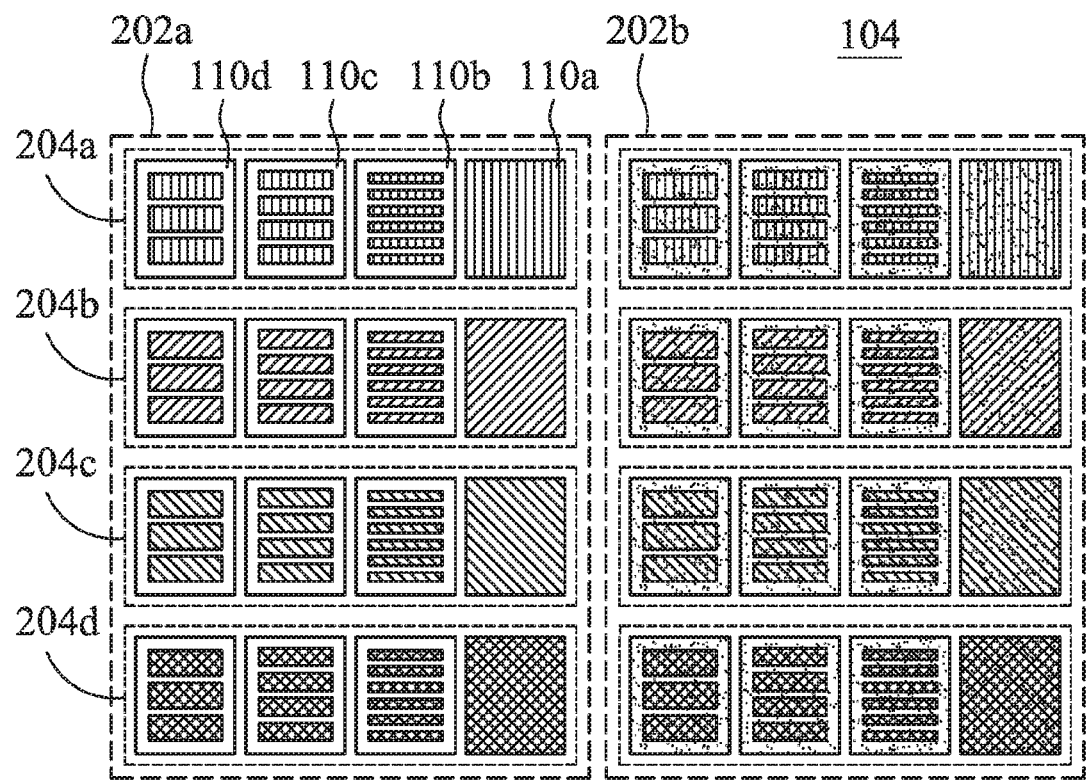
FIG. 2 illustrates a top view of a test key according to an embodiment.

FIG. 2 illustrates a top view of a test key 104 having test key groups 202a and 202b according to an embodiment. Test key 104 may have one or more test key groups 202a and 202b, each test key group 202a and 202b having one or more test key series 204a . . . 204d. Each test key series 204a may have one or more test pad 110a . . . 110d. The different test key groups 202a and 202b, different test key series 204a . . . 204d and different test pads 110a . . . 110d may be used to define different physical characteristic variables, such epitaxial layer type, strain, doping type or concentration, fin size, or other useful characteristics. In an embodiment, the first test key group 202a has test pads 110a . . . 110d formed with a first epitaxial layer type, and the second test key group 202b has test pads 110a . . . 110d formed with a second epitaxial layer type. Additionally, each different test key series 204a . . . 204d has test pads 110a . . . 110d doped with a different doping profile. For example a first test key series 204a series has no doping or implant, and a second, third and fourth test key series 204b, 204c; 204d have different doping concentrations. The test pads 110a . . . 110d within in each test key series 204a . . . 204d have a variety of fin 112 arrangements, with a first test key having a single fin, and a second, third and fourth test pad 110b, 110c, 110d having fins of a variety of widths. In some embodiments the test pads 110a . . . 110d have at least one fin 112, with each test pad 110a . . . 110d having a different number of fins 112. In an embodiment the fins 112 are sized so that a 4PP prober contacts multiple fins for testing, and the test results are adjusted to account for the probe simultaneously testing multiple fins 112 in a test pad 110a . . . 110d.

Figure 3:
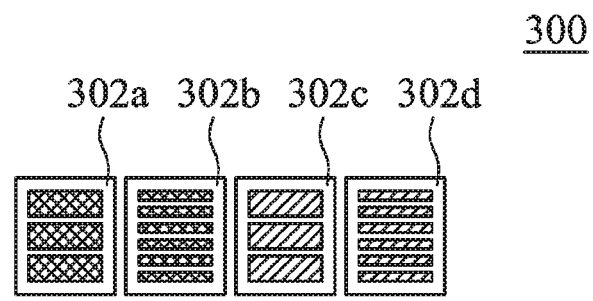
FIG. 3 illustrates a top view of a unique test key according to an embodiment.

FIG. 3 illustrates a top view of a unique test key 300 according to an embodiment. The unique test key 300 has test pads 302a . . . 302d with different physical characteristics. In such a unique test key 300, the test pads 302a . . . 302d may be selected to replicate specific features of structures in a die 102, such as fins of a FinFET or the like. A test key 300 in the scribe line 106 may have features replicating features in a die 102, and the test key 300 may be tested without contaminating actual devices, yet the test key 300 will give accurate test information on the characteristics of the devices on the wafer 100 during processing. For example, for a die 102 having FinFETs, fins 112 may be created in the test key 30 that have an epitaxy profile, size or doping profile similar to the actual FinFET fins. The test key 300 may be tested at various stages of device processing to ensure that the processing is proceeding correctly without the testing disturbing or contaminating the FinFET. For example, a p-channel FinFET may have a fin with a length of 5 μm and a width of 200 nm, and may be formed from SiGe that is formed through selective epitaxy, and then doped with a boron implant. The test pad 302*a* may have similar fins 112 that are formed and implanted during the same procedure as the FinFET device, or may be formed as a separate process. Additionally, other test pads 302*b* . . . 302*d* having different physical characteristics may be formed as well. For example, test pads 302*b* . . . 302*d* having higher doping, or narrower fins 112 may be created to permit testing of variables similar to those of the FinFET device to determine if the wafer processing techniques have come close to rendering a particular structure unusable. The resulting test pads 302*a* . . . 302*d* of the test key 300 will be subject to the same processing as the FinFET. For example, a source or drain is implanted in the FinFET and the dopant activated the test keys 300 may be tested to ensure that the annealing or drive-in thermal processing does not cause the channel dopant to deactivate, diffuse or otherwise fail due to the thermal processing. Similarly, the strain, resistance, carrier mobility and the like may be tested in the test key 300 to ensure that processing of subsequent device elements does not cause the FinFET to fail. While the test key shown in FIG. 3 is shown as having test pads 302*a* . . . 302*d* with characteristics duplicating or similar to a single target FinFET, the test key 300 may have additional test pads 110 duplicating other FinFETs, or may have multiple test pads 110 replicating a single device or type of device, permitting testing and averaging of different test pads or permitting testing of a same condition at different stages of processing.

FIGS. 4A through 4H illustrate cross-sectional views of intermediate steps in a process for forming selectively doped test pads 110 according to an embodiment. While the succeeding figures describe systems and method for creating test pads 110, the description herein is not limited to creating or processing a single test pad, and does not limit the structures in the test pads 110, such as single or multiple fins 112, or other structures.

Figure 4A:
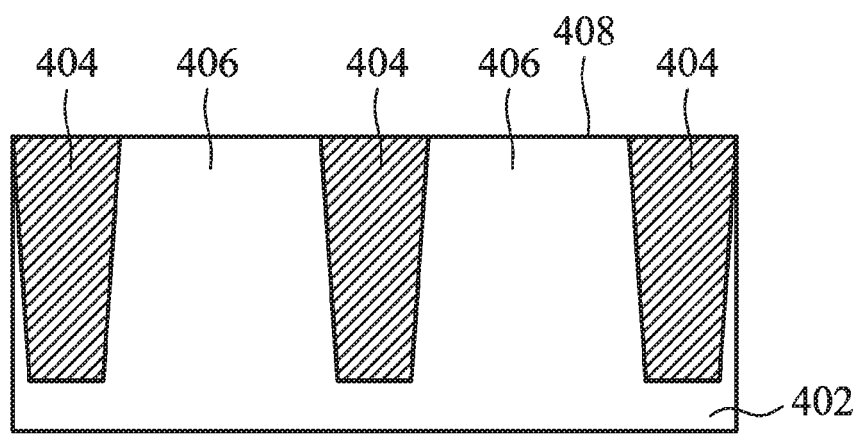
FIGS. 4A through 4H illustrate cross-sectional views of intermediate steps in a process for forming selectively doped test pads according to an embodiment.

FIG. 4A illustrates a cross-sectional view of the initial formation of selectively doped test pads. Initially, one or more shallow trench isolation structures 404 (STIs) are formed in a substrate 402. The substrate 402 is the substrate 402 of a wafer 100, an epitaxial layer, a semiconductor on an insulator (SOI), or the like. Substrate pad portions 406 are disposed between the STIs 404 with a bulk portion of the substrate 402 underlying the STIs 404 and the substrate pad portions 406. In an embodiment, the STIs 404 are formed by masking and etching the substrate 402, and then filling the etched trenches with an insulating material such as silicon dioxide, silicon carbide, glass, silicon nitride, or the like. The STI 404 material may be deposited through, for example, a deposition process such as chemical vapor deposition (CVD) plasma enhanced CVD (PECVD), a spin on procedure, or the like. The top surfaces of the STIs 404 are planarized with the substrate surface 408 by, for example, a chemical mechanical polish (CMP) or the like.

Figure 4B:
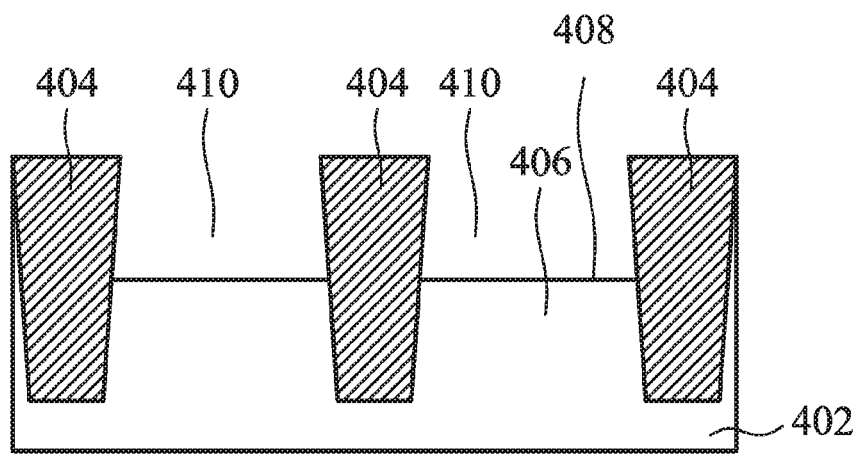

FIG. 4B illustrates a cross-sectional view of forming the test pad regions 410. The substrate surface 408 is recessed or reduced below the top surface of the STIs. For example, the substrate 402 is selectively etched or otherwise reduced by a like process to create test pad regions 410. In an embodiment, the substrate 402 is reduced to a predetermined depth corresponding to a desired fin height. For example, a fin 112 of a test key 104 (See, e.g., FIGS. 1B-3) may need to have a height of about 10 nm to about 90 nm, and so the substrate surface 408 is about 10 nm to about 90 nm below the top surface of the STIs 404.

Figure 4C:
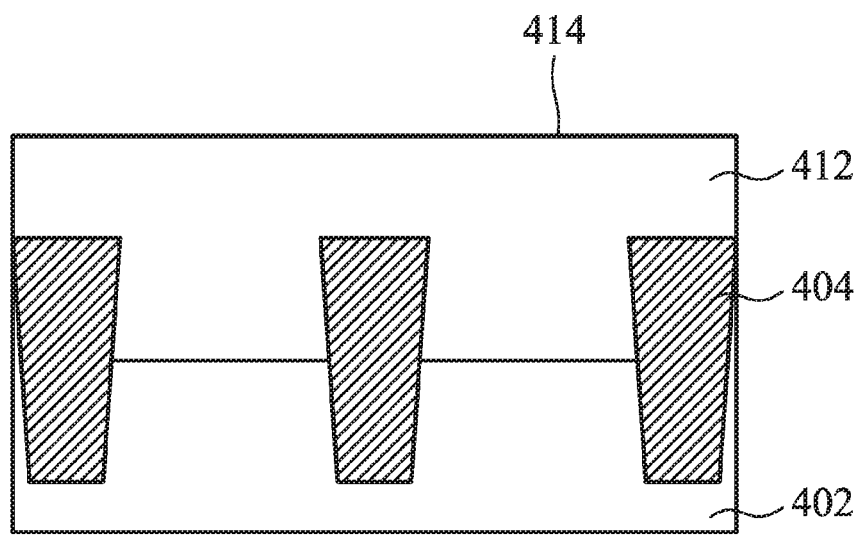

FIG. 4C illustrates a cross-sectional view of forming an epi layer 412. An epi layer 412 is formed over the recessed substrate, through, for example, an epitaxial growth technique. The epi layer 412 has an epi layer top surface 414 at or above the top surface of the STIs 404. In an embodiment, the epi layer 412 is SiGe, but the epi layer 412 may be formed from any suitable material, including, but not limited to silicon, silicon germanium carbide, gallium arsenide, or the like. Additionally, while the epi layer 412 is described herein as being formed by epitaxy, the epi layer 412 may be formed using any suitable deposition or formation process. For example, the substrate 402 may be an insulator, and the epi layer 412 may be silicon deposited by CVD or the like.

Figure 4D:
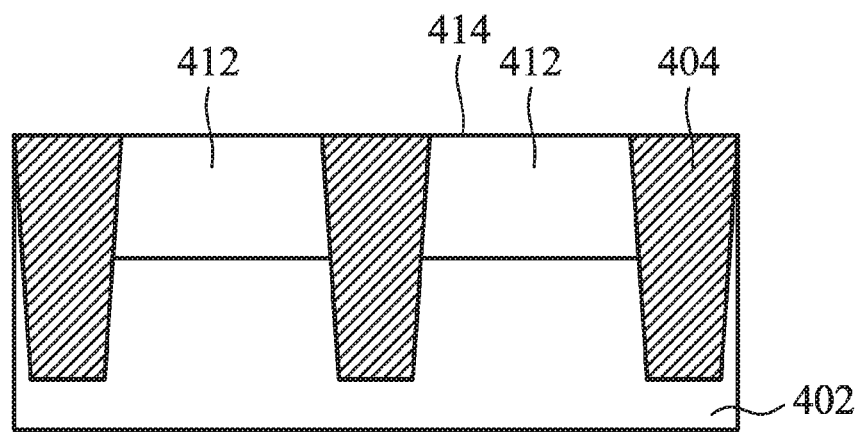

FIG. 4D illustrates a cross-sectional view of reducing the epi layer 412. The epi layer 412 may be planarized or otherwise reduced to have an epi layer top surface 414 that is about level or planar with the top surfaces of the STIs 404.

Figure 4E:
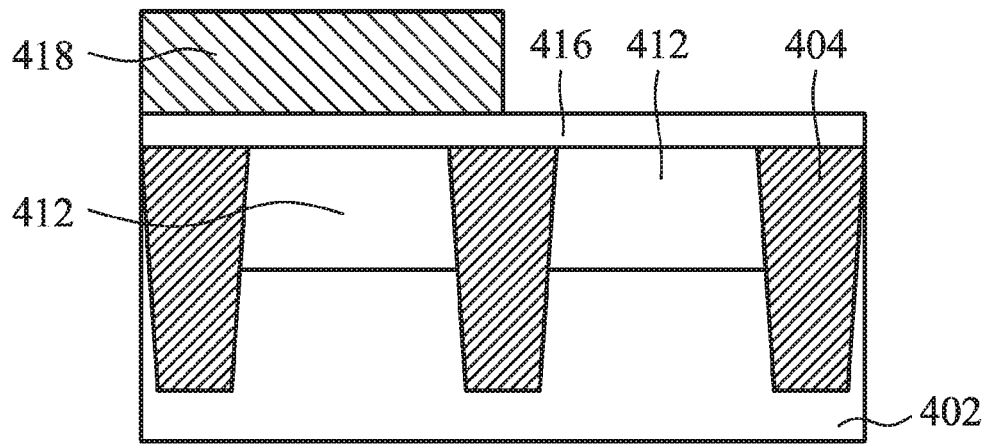

FIG. 4E illustrates a cross-sectional view of masking the epi layer 412 for implant. A mask 416 is formed over the epi layer 412, with a resist 418 formed over the mask 416. The mask 416 reduces the amount of strain relaxation and dopant outdiffusion during subsequent thermal processes. In an embodiment, the resist 418 is a photoresist that is masked, exposed and developed, but in another embodiment, may be another mask patterning structure. The resist 418 may cover one or more test pad regions 410 to prevent an implant from contaminating other test pad regions 410.

Figure 4F:
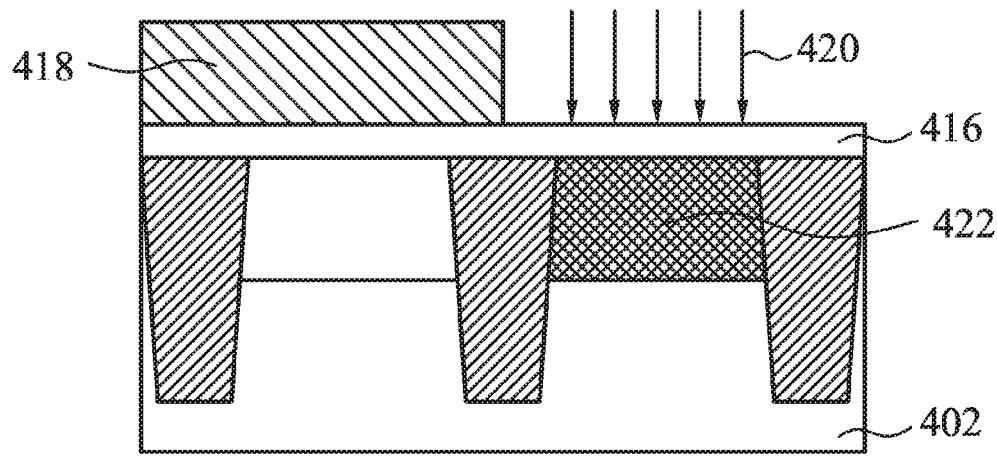

FIG. 4F illustrates a cross-sectional view implanting a portion of the epi layer 412. An implant 420 may be performed on a portion of the epi layer to form a doped test pad 422. For example, boron may be implanted in the test pad 422 to create a p-type implant.

Figure 4G:
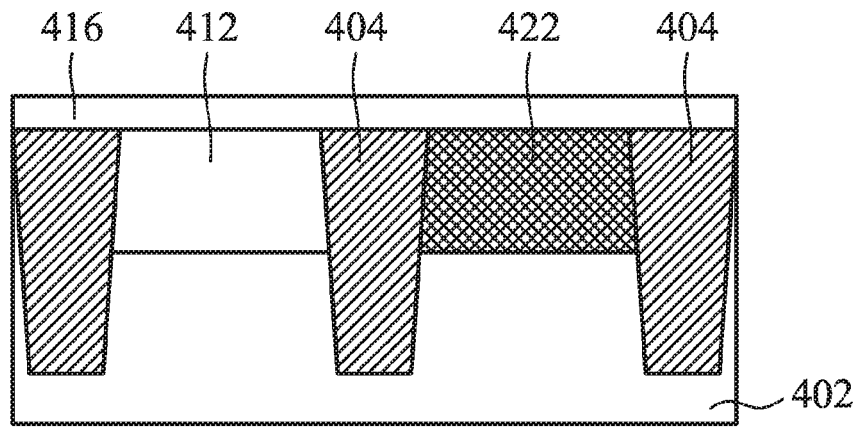

FIG. 4G illustrates a cross-sectional view of removing the resist 418. The resist 418 is removed, for example, by ashing and cleaning in the case of a photoresist mask. In embodiments where the resist 418 is a hard mask, the resist 418 is removed by etching, polishing or another suitable procedure. The implanted test pad 422 may also be thermally activated, annealed or otherwise processed while the mask 416 is in place over the implanted test pad 422.

Figure 4H:
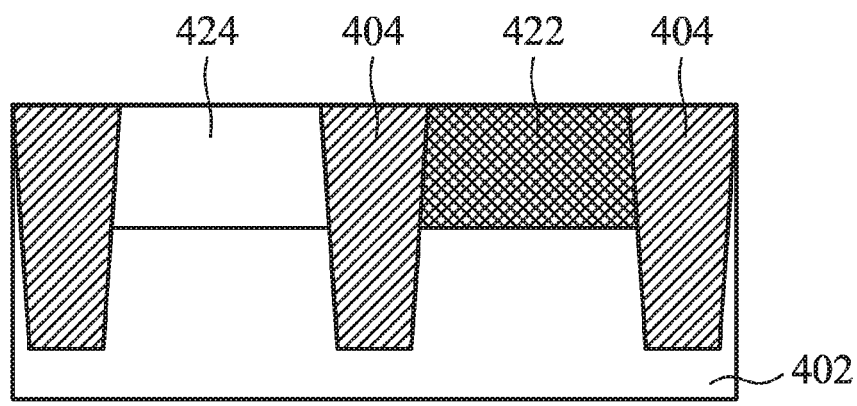

FIG. 4H illustrates a cross-sectional view of removing the mask 416. The cap layer is removed using a polish, CMP, etch or other suitable procedure. The remaining epi layer 412 remains as an undoped test pad 424, with the doped test pad 422 separated from the undoped test pad 424 by an STI 404.

Figure 5A:
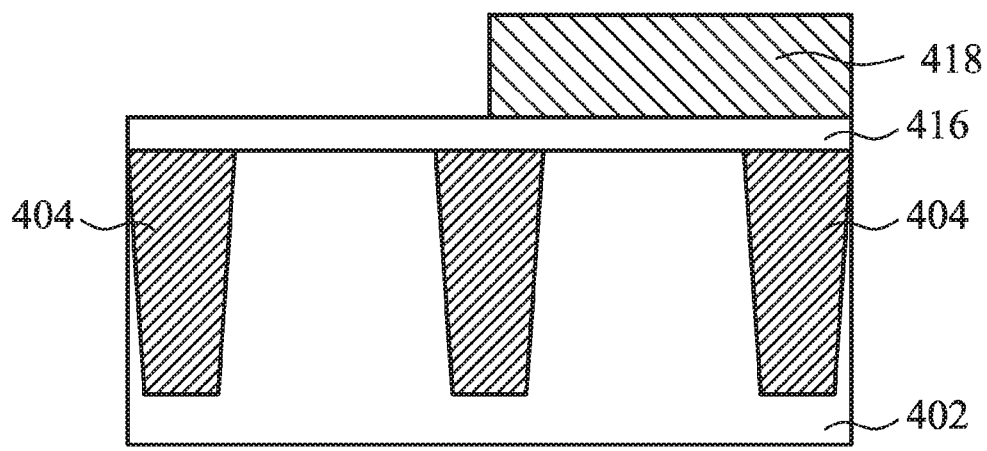
FIGS. 5A through 5J illustrate cross-sectional views of intermediate steps in a process for forming test pads with different epitaxy conditions according to an embodiment.

FIGS. 5A through 5J illustrate cross-sectional views of intermediate steps in a process for forming test pads 110 with different epitaxial characteristics according to an embodiment. FIG. 5A illustrates a cross-sectional view of the masking of a substrate 402 for various epitaxial characteristic test pads. Initially, one or more shallow trench isolation structures 404 (STIs) are formed in a substrate 402 as described with respect to FIG. 4A. A mask 416 is formed over the substrate 402, with a resist 418 formed over the mask 416. The mask 416 may be used as a hard mask defining an area for subsequent epitaxial growth. The mask 416 is etched to expose one or more test pad areas 410.

Figure 5B:
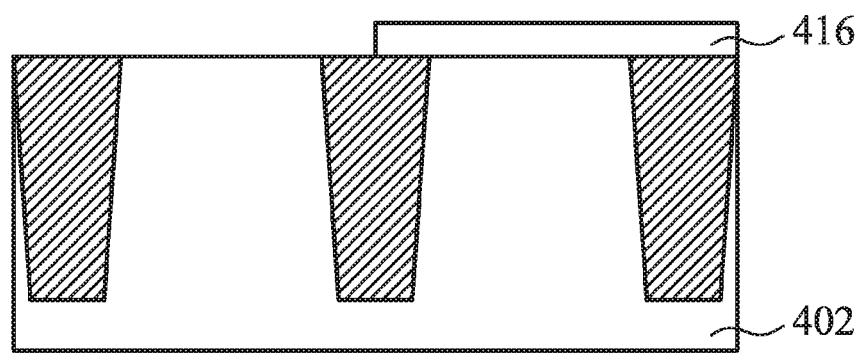

FIG. 5B illustrates a cross-sectional view of removing the resist 418. The mask 416 is patterned through, for example, etching, and the resist 418 is removed. The resist 418 is removed, for example, by ashing and cleaning or by selective etching, polishing or another suitable procedure. The mask 416 is patterned to cover at least one region where a test pad 110 will be formed to permit the selective etching and epitaxial growth of test pads in selected test pad regions 410.

Figure 5C:
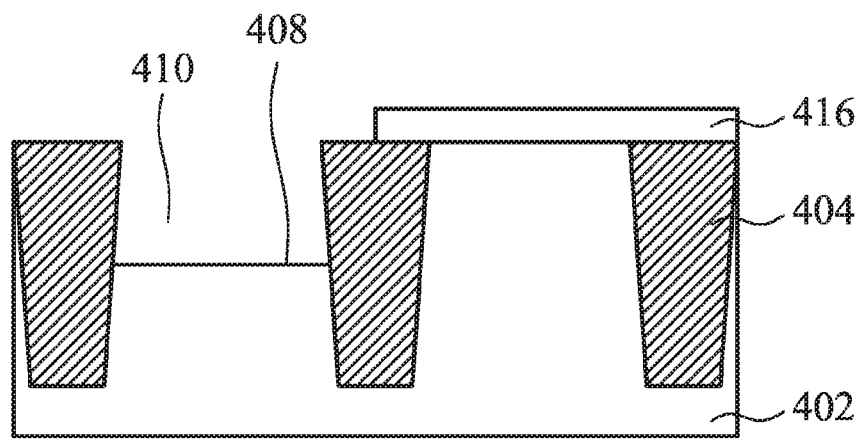

FIG. 5C illustrates a cross-sectional view of forming the test pad regions 410. The substrate surface 408 is recessed or reduced below the top surface of the STIs. The substrate 402 is selectively etched or otherwise reduced as described above with respect to FIG. 4B to create test pad regions 410. In the embodiment shown, a single test pad region 410 is created, with a second test pad region is reduced and filled with an epitaxially grown test pad 502 (See, e.g., FIGS. 5D-5F) in subsequent steps. Such individualized epitaxial growth of test pads 502 permits different test pads 502 to be formed with different epitaxial characteristics.

Figure 5D:
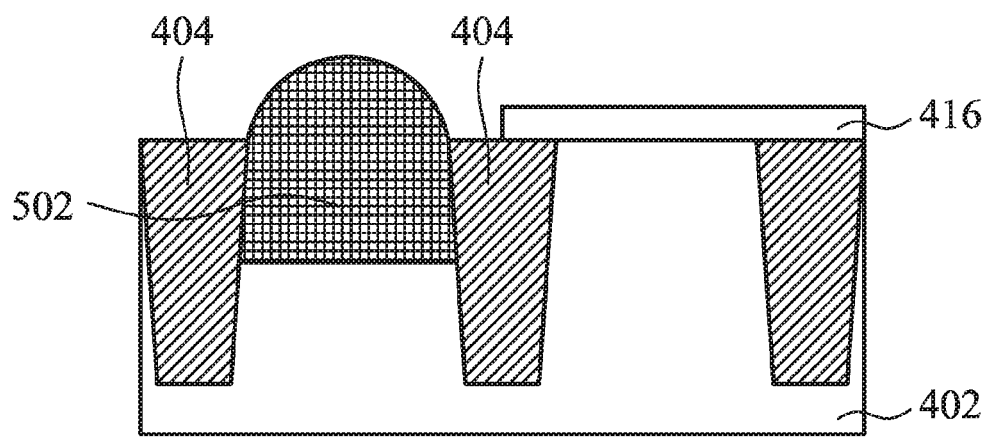

FIG. 5D illustrates a cross-sectional view of forming an epi layer 502 in a single test pad region 410. While the epi layer 502 in a single test pad region 410 is shown, it should be understood that multiple test pad regions 410 may be reduced and filled with an epi layer 502 in a single procedure. The epi layer 502 may be formed as disclosed above with respect to FIG. 4C. In an embodiment, the epi layer is SiGe, but the epi layer 412 may be formed from any suitable material, including, but not limited to silicon, silicon germanium carbide, gallium arsenide, or the like.

Figure 5E:
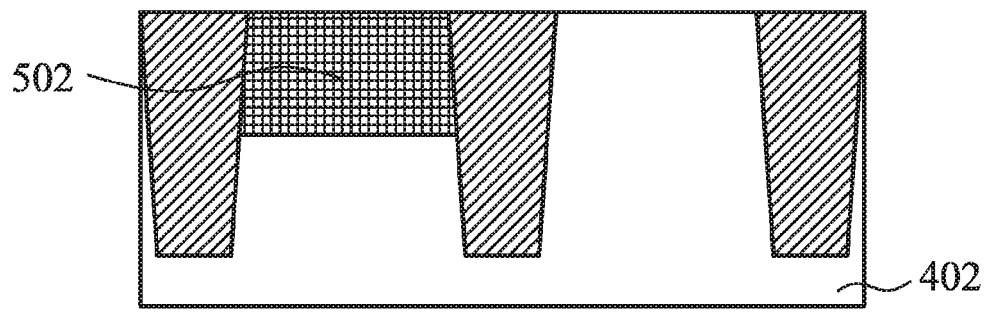

FIG. 5E illustrates a cross-sectional view of reducing the epi layer 412. The mask 416 is removed and the epi test pad 502 planarized or otherwise reduced by, for example, a CMP or suitable process. The resulting epi layer top surface is about level or planar with the top surfaces of the STIs 404.

Figure 5F:
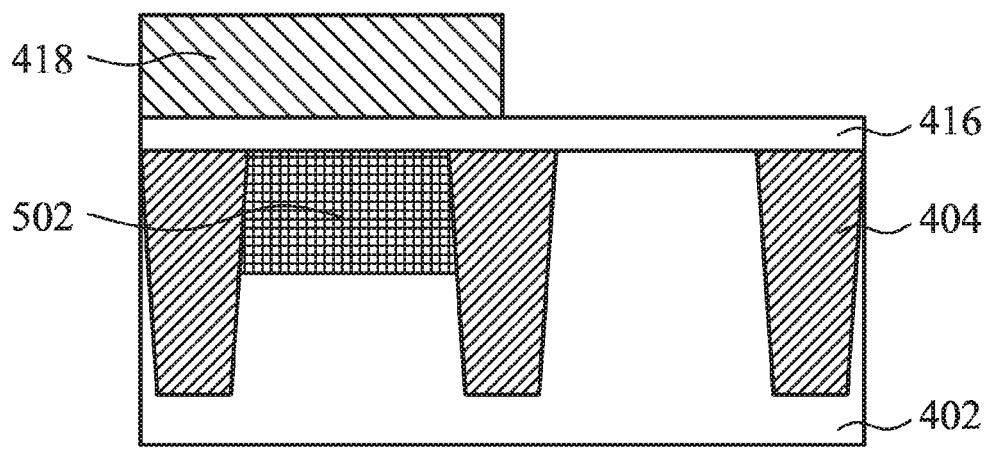
Figure 5G:
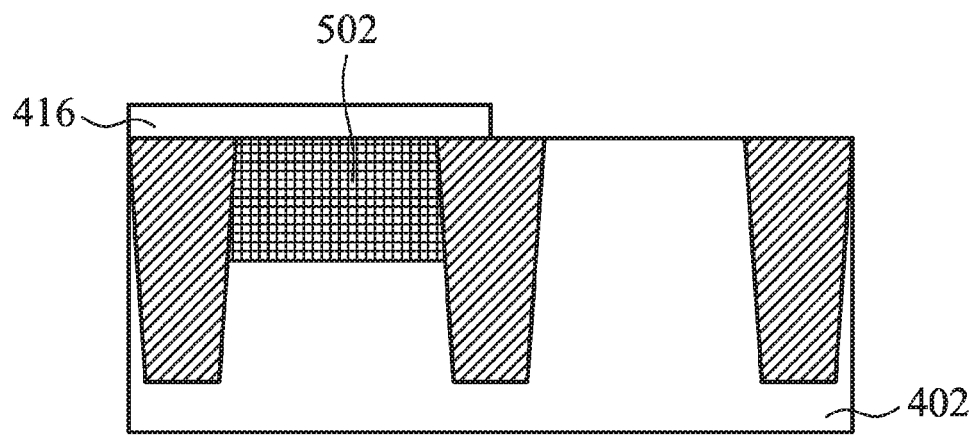
Figure 5H:
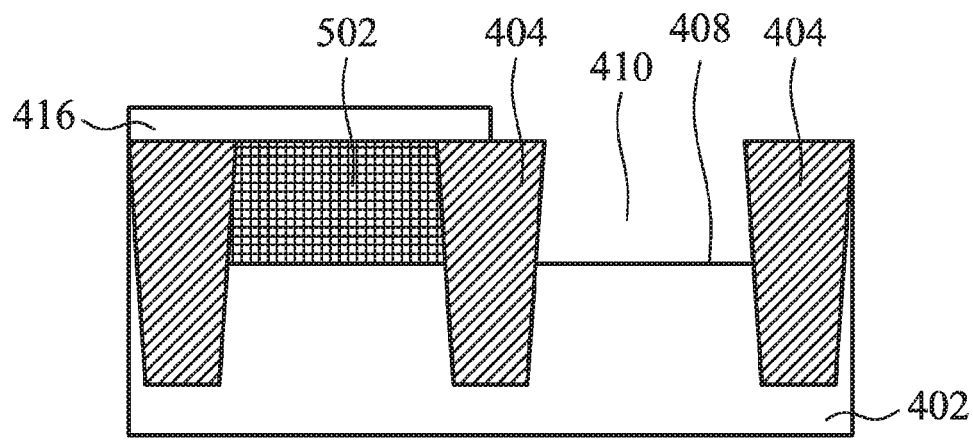
Figure 5I:
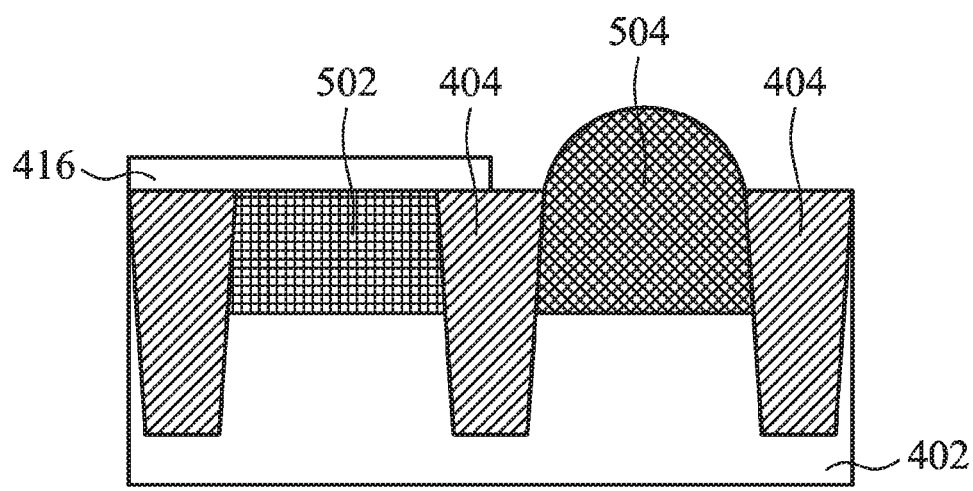

FIGS. 5F through 5I illustrate cross sectional view of forming a separate, second epi test pad 504. A mask 416 is formed and a mask used to pattern the mask 416 as shown in FIGS. 5F and 5G using procedures similar to those disclosed above with respect to FIGS. 5A through 5B. A second test pad region 410 is formed by reducing the substrate as shown FIG. 5H, and a second epi test pad 504 is grown in the second test pad area 410 as shown in FIG. 5I. In an embodiment, the second epi test pad 504 is formed with different characteristics than the first epi test pad 502.

Figure 5J:
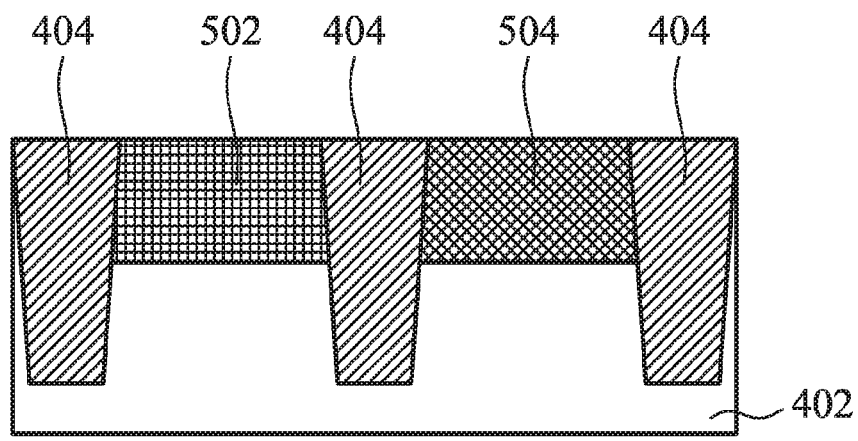

FIG. 5J illustrates a cross-sectional view of removing the mask 416 and reducing the second epi test pad 504. The second epi test pad 504 is reduce to have a top surface about level or planar with the top surfaces of the STIs 404. In an embodiment, the mask 416 is removed and the second epi test pad 504 is reduced by a CMP, polish or other suitable procedure. The resulting structure has a first epi test pad 502 separated from the second epi test pad 504 by an STI, with the first and second epi test pads 502 and 504 having different compositions, materials or other characteristics.

Figure 6A:
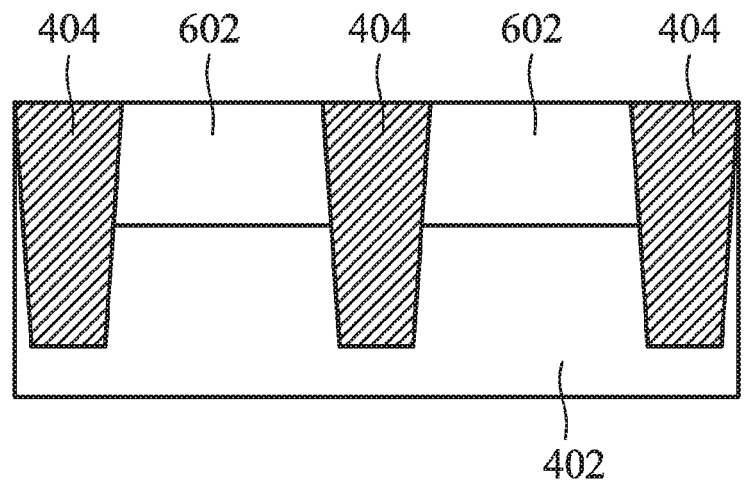
FIGS. 6A through 6D illustrate cross-sectional views of intermediate steps in a process for forming selectively doped test pads according to an embodiment.

FIGS. 6A through 6D illustrate cross-sectional views of intermediate steps in a process for implanting test pads with an implanter scan according to an embodiment. FIG. 6A illustrates a cross-sectional view of an initial structure with epi test pads 602. Epi test pads 602 may be disposed between STIs 404, and in an embodiment, are formed according to the procedures discussed above with respect to FIGS. 5A-5J.

Figure 6B:
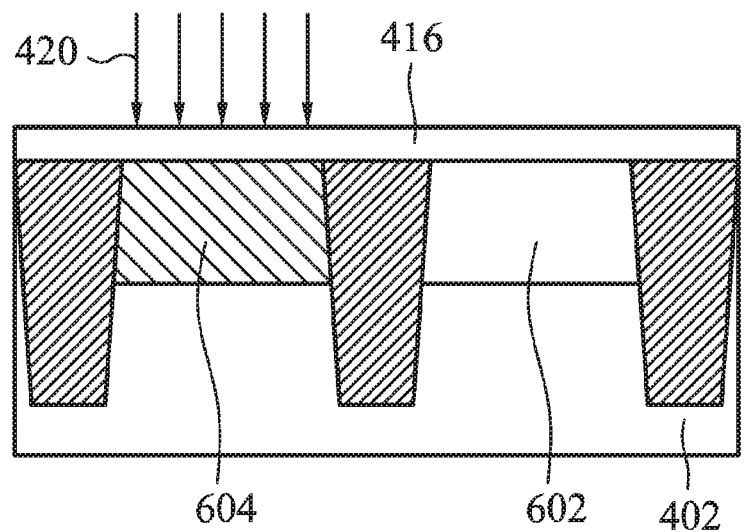
Figure 6C:
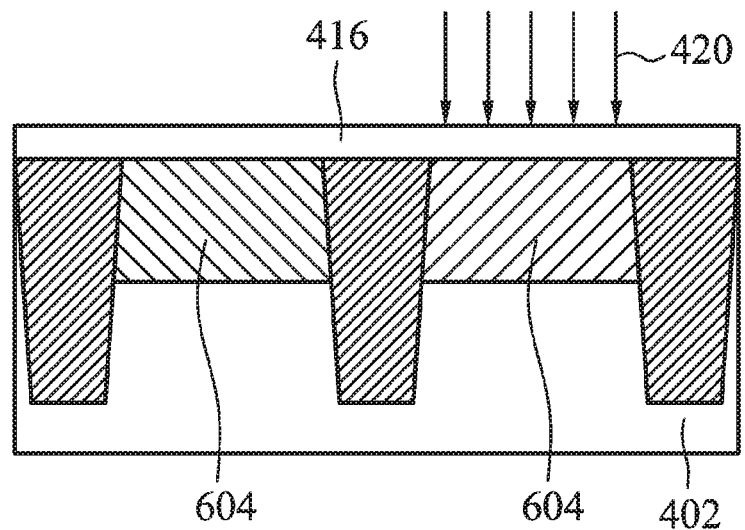
Figure 6D:
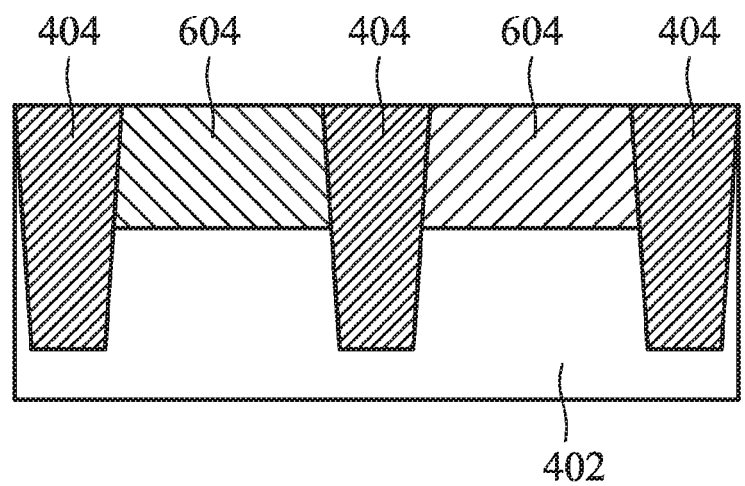

FIG. 6B illustrates a cross-sectional view of an implant 620 with an implant scan. Initially, a mask 416 is disposed over the epi test pads 602. An implanter may be used to implant 420 one or more epi test pads 602 to form a doped test pad 604. The implanter moves to one or more different epi test pads 602 and performs an implant 420 on additional epi test pads 602, as shown in FIG. 6C. In an embodiment, the implanter may implant 420 the epi test pads 602 with different dopants, to different concentrations, or with other different implant parameters to result in doped test pads 604 having different doping profiles. The implanter may implant one or more different die 102 structures, resulting in doped test pads 604 that have doping profiles that are related to the doping profiles of the die 102 structures.

The test pad processing procedures described herein with respect to FIGS. 4A through 6D should be understood to be non-limiting and non-exclusive. For example, the epitaxial test pad formation procedure described with respect to FIGS. 5A through 5J may be performed to generate test pads 110 with different epitaxial characteristics, and then the test pads 110 may be doped by masking and implanting as described with respect to FIGS. 4A through 4H, or by an implant scanner as described with respect to FIGS. 6A through 6D.

Figure 7:
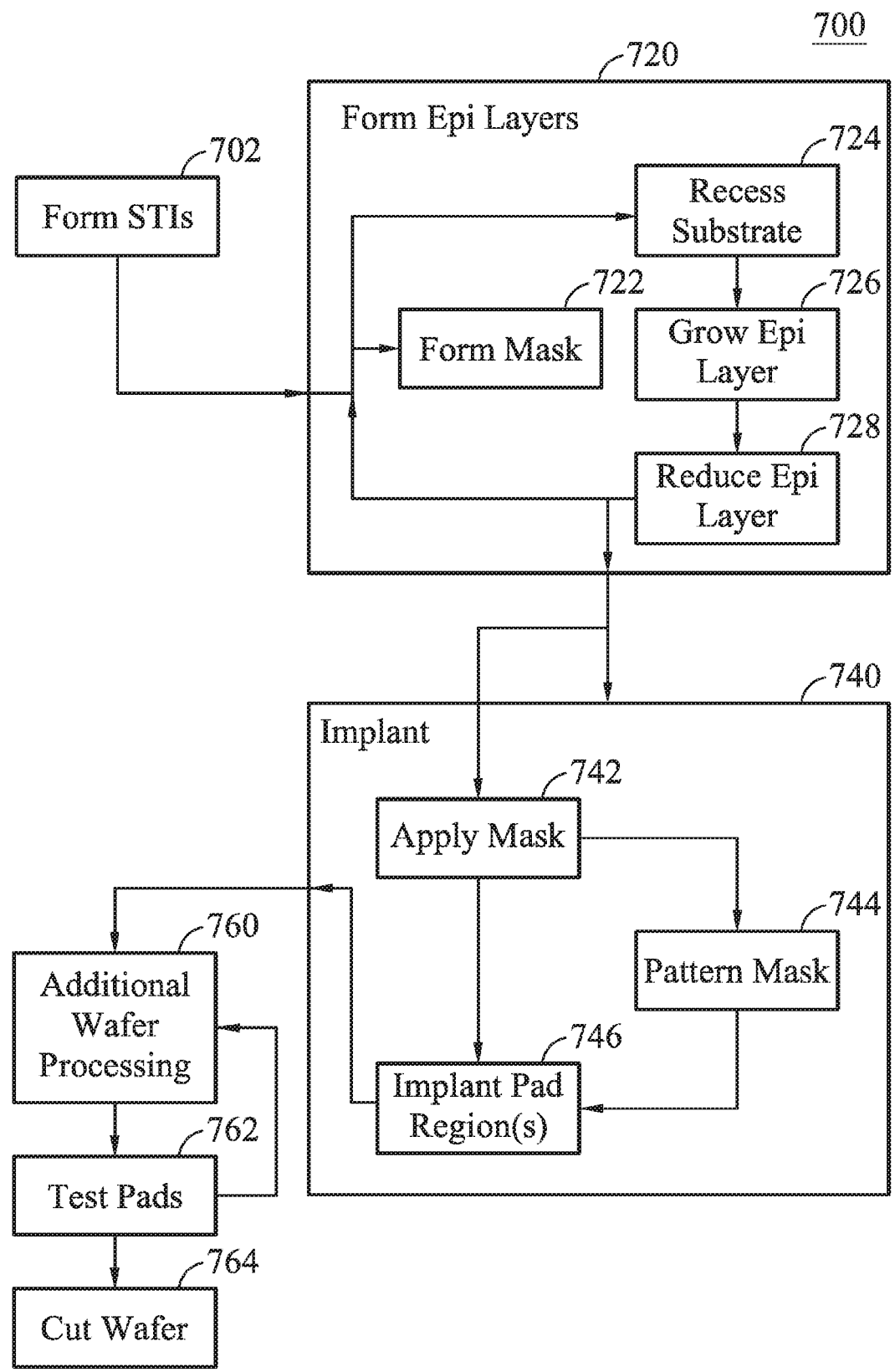
FIG. 7 is a flow diagram illustrating a method of forming and using test keys on a wafer according to an embodiment.

FIG. 7 is a flow diagram illustrating a method 700 of forming and using test keys on a substrate according to an embodiment. STIs are formed in block 702, and then one or more epi pads are formed between the STIs in block 720. The epi pads are formed by optionally patterning a mask over the substrate in block 724 and then recessing the substrate in block 724 to form a test pad regions. An epi layer is formed in block 726 in the test pad regions, and the epi layer is reduced in block 728.

The test pads are implanted in block 740. The test pads are implanted by forming a mask in block 742 and optionally masking and the etching the mask in block 744. The pad regions are implanted with a dopant in block 746 to firm the test pads. Additional wafer processing may be performed in block 760. In an embodiment, the additional processing is a process such as annealing, dopant activation or other semiconductor device fabrication procedures. The test pads may be tested in block 762 using a contact or non-contact type test to determine dopant activation, strain, or using another test procedure for determining the characteristics of a semiconductor region, or the like. Additional wafer processing steps, as in block 760 and additional pad testing as in block 762 may be subsequently performed. The wafer may be cut or singulated in block 764.

Figure 8:
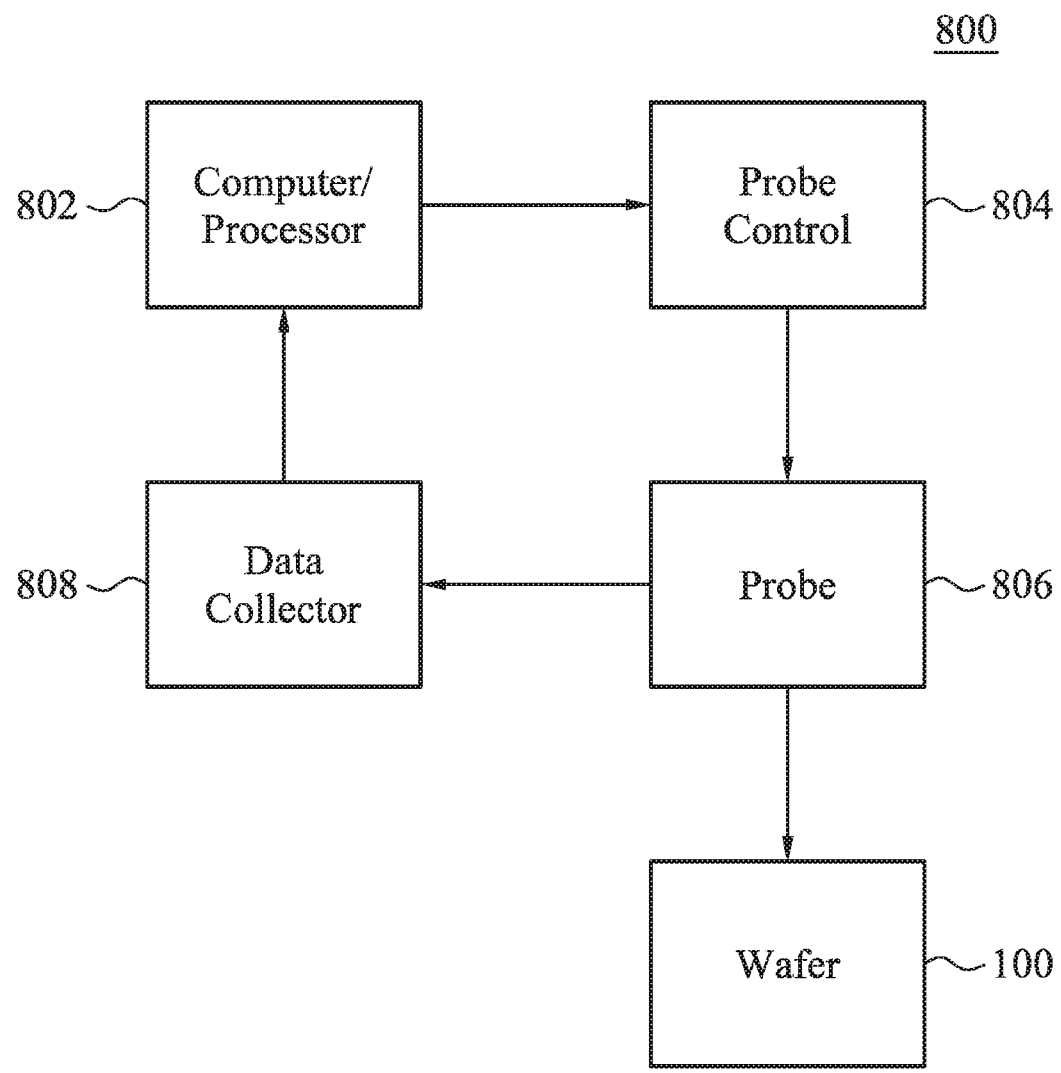
FIG. 8 is a block diagram illustrating a system for testing a wafer having test keys according to any embodiment.

FIG. 8 is a block diagram illustrating a system 800 for testing a wafer having test keys according to any embodiment. A computer 802, processor or other controller issues signals to a probe control to move a probe 806 to contact a wafer 100. The computer 802 may have instructions for controlling a particular probe or set of probes to test a wafer 100 with particular layout. The probe control 804 may also control alignment of the probe 806 with the wafer by moving the probe 806 or the wafer 100 so that the probe 806 contacts a particular test key or test pad. A data collector 808 may take readings from the probe after contact with the test key and send the data to the computer 802. The computer may take the readings form the data collector 808 and generate one or more reports by comparing the data from a particular wafer to a predetermined or expected data set. For example, readings from a wafer may be compared to a set of acceptable tolerances, and a report or warning generated if the readings fall outside the acceptable tolerances.

Wafer having tests pads formed according to an embodiment permits testing of the processes used to form semiconductor devices or structures in dies without the testing contaminating or otherwise interfering with the operating or subsequent processing of the dies. Multiple test pads having different physical characteristics, such as fin structure, may be formed in test key series, with the test pads in different test key series each having different physical characteristics, such as doping. Test key groups may have multiple test key series, with the different test key groups having different physical characteristics, such epitaxial characteristics or layer type.

A method according to an embodiment comprises forming a semiconductor device on a wafer having a substrate and forming a test key on the substrate and in a scribe line of the wafer, the test key having a plurality of first test pads, at least a first test pad of the plurality of test pads having physical characteristics related to a portion of the semiconductor device. At least one epitaxial region is formed in the substrate, the plurality of test pads formed from the at least one epitaxial region. The method further comprises forming at least one shallow trench isolation structures (STIs) in the substrate, the least one test pad formed between at least two of the plurality of STIs. A second test pad of the plurality of test pads is formed in the substrate, the second test pad having at least one physical characteristic different from the first test pad. The first test pad has a first epitaxial characteristic and the second test pad has a second epitaxial characteristic different from the first epitaxial characteristic. The first test pad and the second test pad are formed from a semiconductor compound different from a semiconductor compound of the substrate. The first test pad has a first doping characteristic and the second test pad has a second doping characteristic different from the first doping characteristic.

According to an embodiment, forming a test key comprises forming a plurality of shallow trench isolation structures (STIs) on a substrate of a wafer and in a scribe line of the wafer and forming a test key on the substrate of a wafer and in the scribe line of the wafer. Forming the test key comprises forming at least one test key group having a plurality of test key series, each of the plurality of test key series having a plurality of test pads, each one of the plurality of test key series having a first physical characteristic different from the first physical characteristic of other test key series the at least one first test key group.

According to an embodiment, a wafer comprises at least one dicing street defined on a substrate of the wafer, the at least one dicing street separating die areas, and at least one test key series in one of the at least one dicing street. The at least one test key series comprises a plurality of test pads, each of the plurality of test pads separated from another test pad of the plurality of test pads by a shallow trench isolation structure (STI). Each of the plurality of test pads in each of the at least one test key series with has at least one fin, each test pad of the plurality of test pads in a test key series having a different number of fins.

One general aspect of embodiments disclosed herein includes a wafer, including: at least one dicing street defined on a substrate of the wafer, the at least one dicing street separating die areas; and at least one test key series in the at least one dicing street, the at least one test key series including: a plurality of test pads, each of the plurality of test pads separated from another test pad of the plurality of test pads by a shallow trench isolation structure (STI); where each of the plurality of test pads in each of the at least one test key series has at least one fin, each test pad of the plurality of test pads in a test key series having a different number of fins.

Another general aspect of embodiments disclosed herein includes a wafer, including: a semiconductor die on a substrate; and a test key in a scribe line of the substrate, the test key including: a plurality of shallow trench isolation structures (STIs) in the scribe line and another plurality of STIs in the semiconductor die; and a plurality of test pads, the plurality of test pads formed on the substrate and separated by at least one of the plurality of STIs, a first test pad of the plurality of test pads being a first epitaxial material of the same type as an active device of the semiconductor die, and a second test pad of the plurality of test pads being formed of a second epitaxial material, different than the first epitaxial material, the second epitaxial material being the same type of a second active device of the semiconductor die.

Yet another general aspect of embodiments disclosed herein includes a wafer, including: at least two active die; a scribe line separating the at least two active die; and a first test key series in the scribe line, the first test key series including a plurality of test pads, at least one of the plurality of test pads isolated from neighboring test pads by a shallow trench isolation structure (STI); where each of the plurality of test pads in first test key series has at least one fin, the at least one fin being structurally the same as at least one fin formed in at least one of the at least two active die.

One more general aspect of embodiments disclosed herein includes a wafer, including at least one dicing street defined on a substrate of the wafer, the at least one dicing street separating die areas; and a plurality of test sites in the dicing street. Each of the plurality of test sites has associated with it at least one fin, the at least one fin having a structure replicating a fin of a functional FinFET device, at least one test site of the plurality of test sites differing from the other test sites of the plurality of test sites by a physical characteristic of the at least one fin.

Another general aspect of embodiments disclosed herein includes a wafer, including an active diem a scribe line adjacent the active die, and a plurality of first test pads at least one of the plurality of first test pads isolated from neighboring test pads by a shallow trench isolation structure (STI). Each of the plurality of first test pads in a first test key series has at least one fin, the at least one fin being structurally the same as at least one fin of a FinFET transistor formed in the active die.

Yet another general aspect of embodiments disclosed herein includes a wafer including an active die including an active FinFET device, and a scribe line adjacent the active die, the scribe line having therein a plurality of test key series. Each test key series includes a dummy FinFET device being structurally the same as the active FinFET device. A first test key series of the plurality of test key series has a first characteristic and a second test key series of the plurality of test key series has a second characteristic different than the first characteristic, the characteristic being selected from the group including of number of fins, epitaxial characteristic, doping profile, and fin size.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, and composition of matter, means, methods or steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A wafer, comprising:
at least one dicing street defined on a substrate of the wafer, the at least one dicing street separating die areas; and
a plurality of test sites in the at least one dicing street;
wherein each of the plurality of test sites has associated with it at least one fin, the at least one fin having a structure replicating a fin of a functional finFET device, at least one test site of the plurality of test sites differing from the other test sites of the plurality of test sites by a physical characteristic of the at least one fin.

2. The wafer of claim 1, wherein the at least one fin is formed from a compound different from a compound of the substrate.

3. The wafer of claim 1, wherein the at least one fin has a physical characteristics related to a structure of at least one semiconductor device in the die areas.

4. The wafer of claim 1, wherein the plurality of test sites is organized into a plurality of test key series, a first test key series of the plurality of test key series having a first doping profile and a second test key series of the plurality of test key series having a second doping profile different from the first doping profile.

5. The wafer of claim 1, wherein the plurality of test sites is organized into a plurality of test key series, a first test key series of the plurality of test key series having a first epitaxial characteristic and a second test key series of the plurality of test key series having a second epitaxial characteristic different from the first epitaxial characteristic.

6. The wafer of claim 1, wherein the at least one fin includes an epitaxial region in the substrate.

7. The wafer of claim 1, wherein the plurality of test sites is organized into a plurality of test key series, a first test key series of the plurality of test key series having a first fin width and a second test key series of the plurality of test key series having a second fin width different from the first fin width.

8. The wafer of claim 1, wherein the plurality of test sites is organized into a plurality of test key series, a first test key series of the plurality of test key series having fins with a first strain type and a second test key series of the plurality of test key series having fins with a second strain type different from the first strain type.

9. The wafer of claim 1, wherein respective ones of the plurality of test sites are isolated from neighboring test sites by a shallow trench isolation structure.

10. A wafer, comprising:
an active die;
a scribe line adjacent the active die; and
a plurality of first test pads, at least one of the plurality of first test pads isolated from neighboring test pads by a shallow trench isolation structure (STI);
wherein each of the plurality of first test pads in a first test key series has at least one fin, the at least one fin being structurally the same as the at least one fin of a FinFET transistor formed in the active die.

11. The wafer of claim 10, wherein the at least one fin of the first test key series has a different doping profile from a doping profile of the at least one fin of a second test key series.

12. The wafer of claim 10, wherein the first test key series comprises at least one epitaxial region in a substrate in which the first test key series is formed, the plurality of first test pads formed in the at least one epitaxial region.

13. The wafer of claim 10, wherein the plurality of first test pads are formed of a semiconductor material having a lattice mismatch with a material of a substrate in which the active die is formed.

14. The wafer of claim 10, wherein the at least one fin of the first test key series has a different epitaxial characteristic from an epitaxial characteristic of the at least one fin of a second test key series.

15. The wafer of claim 10, further comprising a second test key series and wherein the first test key series has a first number of fins therein and the second test key series has a second number of fins therein different from the first number of fins.

16. The wafer of claim 10, wherein the at least one fin of the first test key series and at least one fin of a second test key series are formed from a semiconductor compound different from a semiconductor compound of a substrate in which the first test key series is formed.

17. A wafer comprising:
an active die comprising an active FinFET device; and
a scribe line adjacent the active die, the scribe line having therein a plurality of test key series, each test key series of the plurality of test key series including a dummy FinFET device being structurally the same as the active FinFET device, wherein a first test key series of the plurality of test key series has a first characteristic and a second test key series of the plurality of test key series has a second characteristic different from the first characteristic, the first and second characteristics being selected from the group consisting of number of fins, epitaxial characteristic, doping profile, and fin size.

18. The wafer of claim 17, wherein each test key series of the plurality of test key series comprises a plurality of test pads and respective test pads are separated from one another by a shallow trench isolation.

19. The wafer of claim 17, wherein each of a plurality of test pads in a least one test key series of the plurality of test key series is formed of a compound different from a compound of a substrate in which the plurality of test key series is formed.

20. The wafer of claim 17, wherein the dummy FinFET device includes an epitaxial region in a substrate.

* * * * *